US008731733B2

(12) United States Patent
Patel et al.

(10) Patent No.: US 8,731,733 B2
(45) Date of Patent: May 20, 2014

(54) MANAGEMENT SYSTEM OPERABLE UNDER MULTIPLE METRIC LEVELS

(75) Inventors: Chandrakant Patel, Fremont, CA (US); Cullen E. Bash, Los Gatos, CA (US); Ratnesh Kumar Sharma, Union City, CA (US); Amip J. Shah, Santa Clara, CA (US); Abdlmonem Beitelmal, Los Altos, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 421 days.

(21) Appl. No.: 12/935,904

(22) PCT Filed: Apr. 1, 2008

(86) PCT No.: PCT/US2008/058978
§ 371 (c)(1),
(2), (4) Date: Sep. 30, 2010

(87) PCT Pub. No.: WO2009/123617
PCT Pub. Date: Oct. 8, 2009

(65) Prior Publication Data
US 2011/0029152 A1 Feb. 3, 2011

(51) Int. Cl.
*G05D 23/00* (2006.01)
(52) U.S. Cl.
USPC .......................................................... 700/300
(58) Field of Classification Search
USPC .......................................................... 700/300
See application file for complete search history.

(56) References Cited

U.S. PATENT DOCUMENTS

| 4,084,388 | A | * | 4/1978 | Nelson | 62/152 |
| 4,258,780 | A | * | 3/1981 | Suo | 165/45 |
| 4,393,663 | A | * | 7/1983 | Grunes et al. | 62/119 |
| 5,307,645 | A | * | 5/1994 | Pannell | 62/244 |
| 6,305,180 | B1 | * | 10/2001 | Miller et al. | 62/259.2 |
| 6,374,627 | B1 | * | 4/2002 | Schumacher et al. | 62/259.2 |
| 6,538,883 | B1 | * | 3/2003 | Greer | 361/679.47 |
| 6,545,862 | B1 | * | 4/2003 | Gettemy et al. | 361/679.3 |
| 6,553,778 | B2 | * | 4/2003 | Tipton et al. | 62/196.1 |
| 6,574,104 | B2 | * | 6/2003 | Patel et al. | 361/695 |
| 6,694,759 | B1 | * | 2/2004 | Bash et al. | 62/180 |
| 6,747,872 | B1 | * | 6/2004 | Patel et al. | 361/695 |
| 6,807,056 | B2 | * | 10/2004 | Kondo et al. | 361/689 |
| 6,867,967 | B2 | * | 3/2005 | Mok | 361/679.49 |
| 6,924,981 | B2 | * | 8/2005 | Chu et al. | 361/696 |
| 7,724,149 | B2 | * | 5/2010 | Kettler et al. | 340/584 |
| 8,295,047 | B1 | * | 10/2012 | Hamburgen et al. | 361/699 |
| 8,392,035 | B2 | * | 3/2013 | Patel et al. | 700/300 |

(Continued)

FOREIGN PATENT DOCUMENTS

JP   2007-303725   11/2007

*Primary Examiner* — Mohammad Ali
*Assistant Examiner* — Sivalingam Sivanesan

(57) ABSTRACT

A system for managing a structure having cooling fluid configured to flow around and absorb heat from components contained in the structure includes a plurality of separate cooling mechanisms configured to absorb heat from the cooling fluid. At least two of the plurality of separate cooling mechanisms have at least one different level of a metric with respect to each other. The system also includes a controller configured to implement the plurality of separate cooling mechanisms in a staged manner to remove heat from the cooling fluid. The staged manner includes implementing the cooling mechanism having a relatively lower at least one metric level first and implementing a cooling mechanism having a relatively higher at least one metric level last, to cool the structure.

21 Claims, 6 Drawing Sheets

(56) References Cited

U.S. PATENT DOCUMENTS

| | | |
|---|---|---|
| 2002/0092318 A1* | 7/2002 | Tipton et al. ............... 62/510 |
| 2004/0089011 A1* | 5/2004 | Patel et al. ............... 62/259.2 |
| 2004/0090729 A1* | 5/2004 | Beitelmal et al. ........... 361/103 |
| 2004/0109288 A1* | 6/2004 | Beitelmal et al. ........... 361/687 |
| 2004/0118143 A1* | 6/2004 | Bash et al. ............... 62/259.2 |
| 2004/0141542 A1* | 7/2004 | Sharma et al. .............. 374/141 |
| 2006/0162364 A1* | 7/2006 | Felcman et al. ............ 62/259.2 |
| 2008/0204999 A1* | 8/2008 | Clidaras et al. ............ 361/696 |

\* cited by examiner

MANAGEMENT SYSTEM OPERABLE UNDER MULTIPLE METRIC LEVELS

CROSS-REFERENCE TO RELATED APPLICATION

The present application is related to commonly assigned and co-pending U.S. patent application Ser. No. 11/796,944, entitled "System and Method for Modular Computing", filed on Apr. 30, 2007, the disclosure of which is hereby incorporated by reference in its entirety.

BACKGROUND

Various types of cooling mechanisms have been employed to cool spaces in various types of structures, such as, buildings, data centers, electronics racks, and servers. The cooling mechanisms typically include air conditioning units selected based upon the maximum heat loads predicted to occur in the structures. In this regard, the structures are often provisioned with a single, high output air conditioning unit configured to operate at substantially maximum levels according to the predicted maximum heat loads.

In other instances, the structures are provisioned with multiple high output air conditioning units positioned at multiple locations in the structures and designed to provide substantially maximum levels of cooling to the respective locations in the structures. In these instances, the air conditioning units typically consume the same amount of power with respect to each other and are also configured to operate at substantially maximum power levels according to the predicted maximum heat loads in the structures.

In conventional structures, however, the heat load levels typically remain below the predicted maximum levels and thus, operating the air conditioning units consistently at the maximum levels often results in over-cooling of the structures. This leads to wasted energy and increased operational costs.

It would therefore be beneficial to be able to cool the structures while substantially minimizing energy consumption.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein is a system for managing a structure having cooling fluid configured to flow around and absorb heat from components contained in the structure. The system includes a plurality of cooling mechanisms configured to remove heat from the cooling fluid, where at least two of the cooling mechanisms have different energy consumption levels with respect to each other. The amount of heat removed from the cooling fluid is varied through modulation of one or more of the cooling mechanisms. In addition, the cooling mechanisms are manipulated to substantially minimize at least one level of a metric, such as, the amount of energy consumed, the amount of energy destroyed, the total cost of ownership involved, etc., in cooling the cooling fluid to desired temperature ranges.

According to an example, the cooling mechanism having a relatively lower metric level, such as, the lowest metric level, is activated first and the cooling mechanism having a relatively higher metric level, such as, the highest metric level, is activated last when increased cooling is required. When decreased cooling is required, the cooling mechanism having a relatively higher metric level, such as, the highest metric level, is activated first and the cooling mechanism having a relatively lower metric level, such as, the lowest metric level, is activated last.

Also disclosed herein is a method for managing a structure using a plurality of cooling mechanisms, where at least two of the plurality of cooling mechanisms have different levels of at least one metric with respect to each other. In the method, the plurality of cooling mechanisms may be operated to substantially ensure that provisions of one or more service level agreements (SLAs) are met. The one or more SLAs may be interpreted to define, for instance, the temperature setting at inlets of computing devices with the goal of driving the supply air temperatures at the inlets as high as reasonably possible while remaining with the interpreted provisions of the one or more SLAs. By way of example, an SLA that requires greater uptime may cause the inlet temperature to be set to a lower temperature as compared with an SLA that focuses more on energy conservation.

Figure 1:
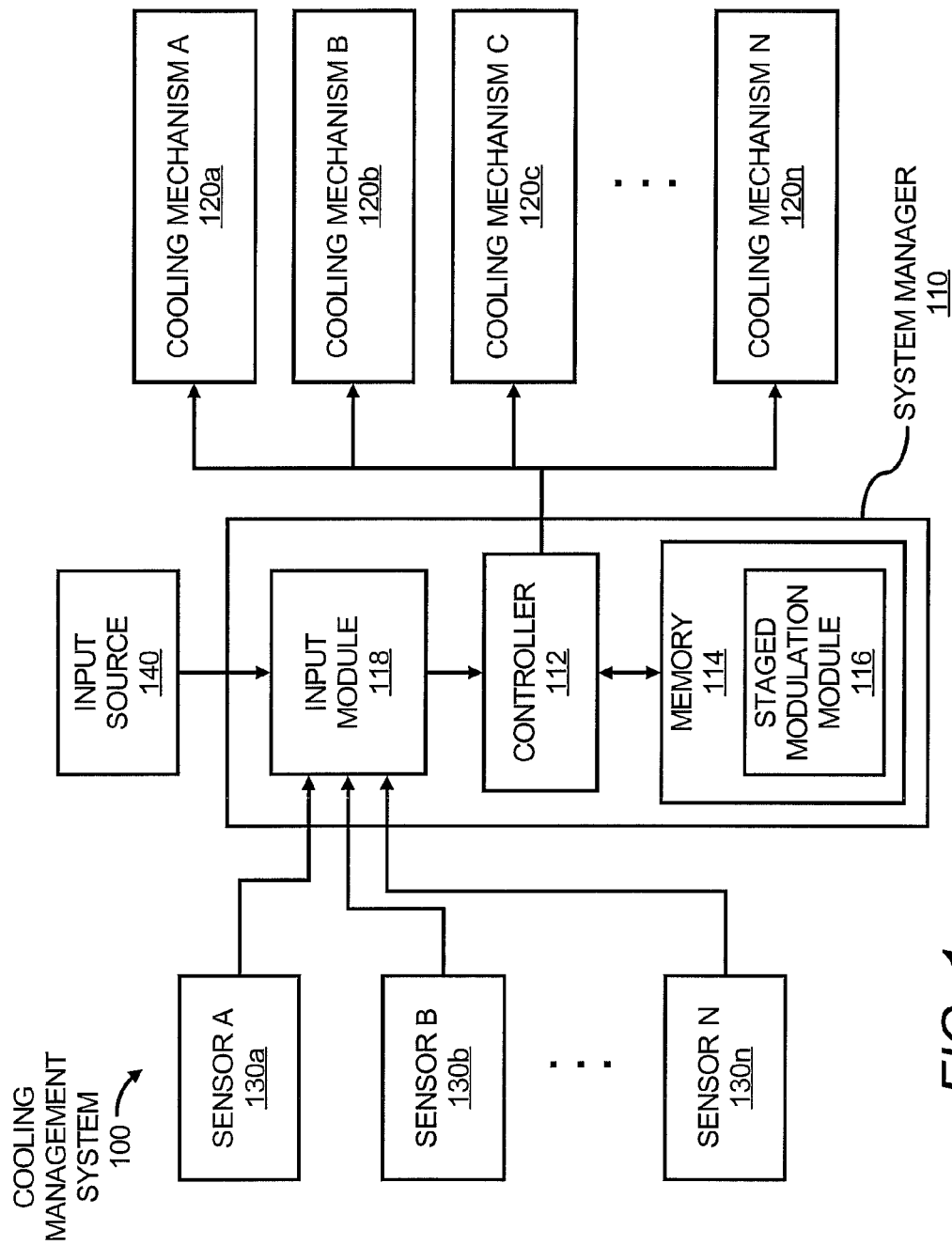
FIG. 1 shows a block diagram of a system for managing cooling in a structure, according to an embodiment of the invention.

With reference first to FIG. 1, there is shown a block diagram of a system 100 for managing cooling in a structure, according to an example. It should be understood that the following description of the block diagram is but one manner of a variety of different manners in which such a cooling management system 100 may be configured. In addition, it should be understood that the cooling management system 100 may include additional components and that some of the components described herein may be removed and/or modified without departing from a scope of the cooling management system 100.

The structure may comprise, for instance, a relatively large structure, such as, a single-story building, a multi-story building, a room, a data center, etc. The structure may also comprise a relatively smaller structure, such as, an electronics cabinet housing a plurality of electronic components, such as, servers, memories, power supplies, switches, etc. The structure may further comprise a vehicle such as, an automobile, a train, a boat, an airplane, etc. In any regard, the structure includes cooling fluid, which may comprise a liquid, a gas, or a combination thereof, configured to flow within or through the structure to thereby cool the interior of the structure and the components housed therein. By way of example, the cooling fluid may comprise air or other fluid means for absorbing heat energy and transporting the heat energy from a location to another, thereby dissipating heat from the location. Examples of suitable structures are shown in later figures and discussed below.

As shown in FIG. 1, the cooling management system 100 includes a system manager 110, which generally comprises a computing device configured to perform various functions in the cooling management system 100. The system manager 110 includes a controller 112, which may comprise a microprocessor, a micro-controller, an application specific integrated circuit (ASIC), and the like, configured to perform various processing functions. In addition, or alternatively, the controller 112 may comprise software operating in any of a number of computing devices.

The system manager 110 may comprise a computing device and the controller 112 may comprise a microprocessor of the computing device. The controller 112 accesses a memory 114 configured to store software or algorithms that provide the functionality of the controller 112. In this regard, the memory 114 may comprise, for instance, volatile or non-volatile memory, such as DRAM, EEPROM, MRAM, flash memory, floppy disk, a CD-ROM, a DVD-ROM, or other optical or magnetic media, and the like.

The memory 114 includes a staged modulation module 116, which the controller 112 is configured to invoke or implement in controlling a plurality of cooling mechanisms 120a-120n, where "n" is an integer greater than one. The staged modulation module 116 comprises software, hardware, or a combination thereof designed to identify which of the plurality of cooling mechanisms 120a-120n is to be modulated in response to conditions detected by one or more sensors 130a-130n, where "n" is an integer greater than one. More particularly, the staged modulation module 116, when implemented or invoked, is configured to modulate the cooling mechanisms 120a-120n in a staged manner that substantially minimizes at least one level of a metric of a plurality of cooling mechanisms 120a-120n, such as, the amount of energy consumed, the amount of energy destroyed, the total cost of ownership involved, etc., in substantially maintaining one or more environmental conditions, such as, temperatures, pressures, airflow rates, airflow velocities, vapor phase or quality, etc., detected by the sensors 130a-130n within one or more predetermined ranges. According to an example, the staged modulation module 116 may modulate one or more of the plurality of separate cooling mechanisms 120a-120n based upon their respective levels of at least one metric, as described in greater detail herein below with respect to FIG. 2.

The one or more predetermined ranges may be selected based upon one or more factors, which may include, for instance, safe operating temperature ranges, humidity ranges, airflow volume ranges, etc., for various components housed in the structure as set forth by the component manufacturers or as determined through testing. The factors may also include environmental condition settings as set forth in or derived from one or more service level agreements (SLAs). The system manager 110 may receive the predetermined ranges and/or information pertaining to the one or more SLAs from an input source 140. The input source 140 may comprise a computing device that a user may implement in inputting data into the system manager 110. In this regard, the input source 140 may be directed connected to the system manager 110 as a peripheral device or the input source 140 may be connected to the system manager 110 through a network, such as, the Internet.

The at least one level of the metric for each of the cooling mechanisms 120a-120n may also be inputted into the system manager 110 through the input source 140. The metric levels may be stored in the memory 114 or other data store and may be accessed in a staged modulation operation of the cooling mechanisms 120a-120n. According to an example, one or more of the cooling mechanisms 120a-120n may comprise passive cooling mechanisms that require little or no electrical energy to operate. In addition, one or more of the cooling mechanisms 120a-120n may comprise active cooling mechanisms that require electrical energy to operate. The one or more passive cooling mechanisms and the one or more active cooling mechanisms each include a cooling medium configured to move between a heat absorption section, such as, an evaporator section, and a heat removal section, such as, a condenser section or heat exchanger section.

Figure 3:
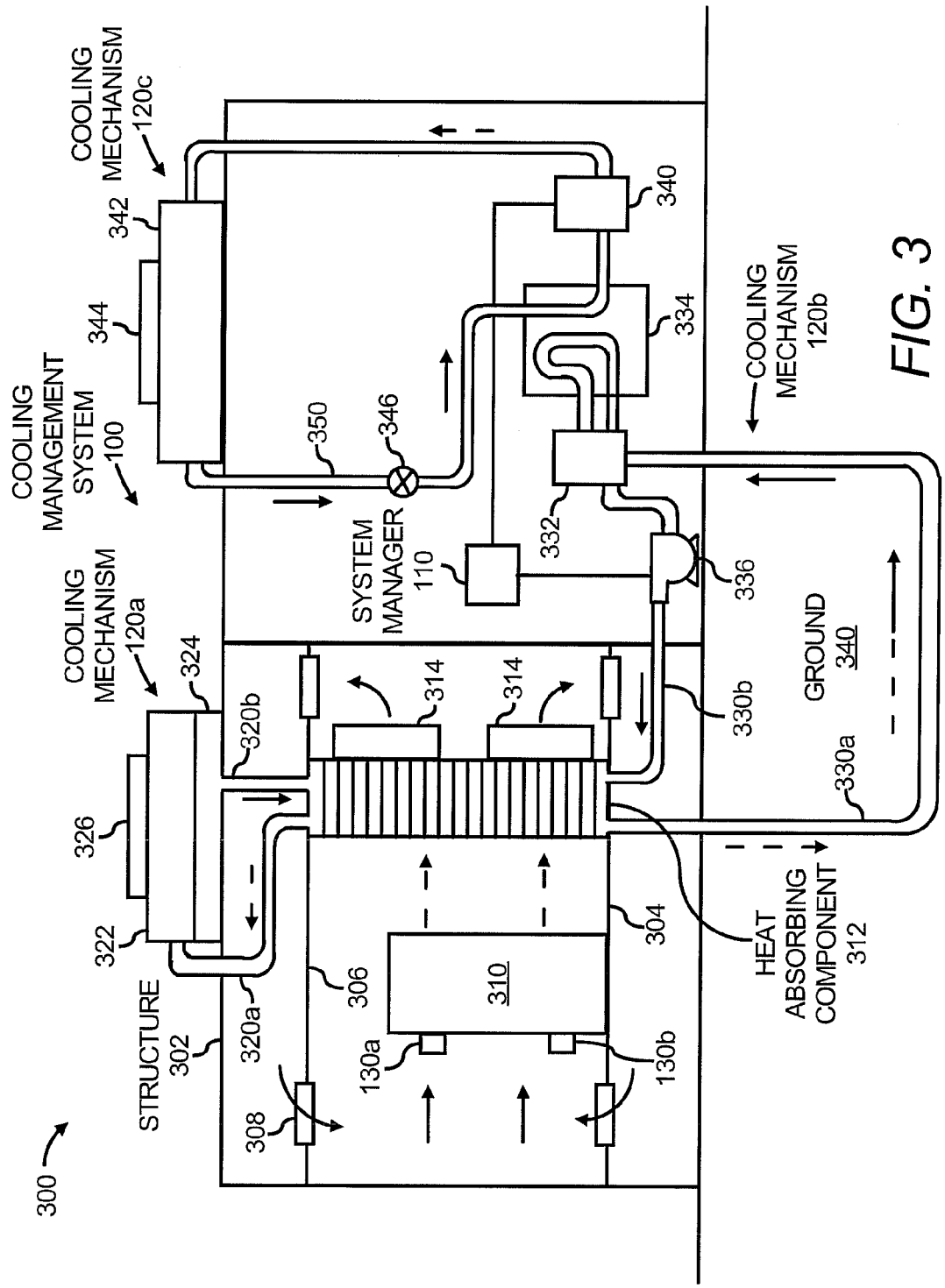
FIGS. 3-5, respectively, show simplified schematic diagrams of various structures having a cooling management system composed of a plurality of cooling mechanisms, according to an embodiment of the invention.
Figure 4:
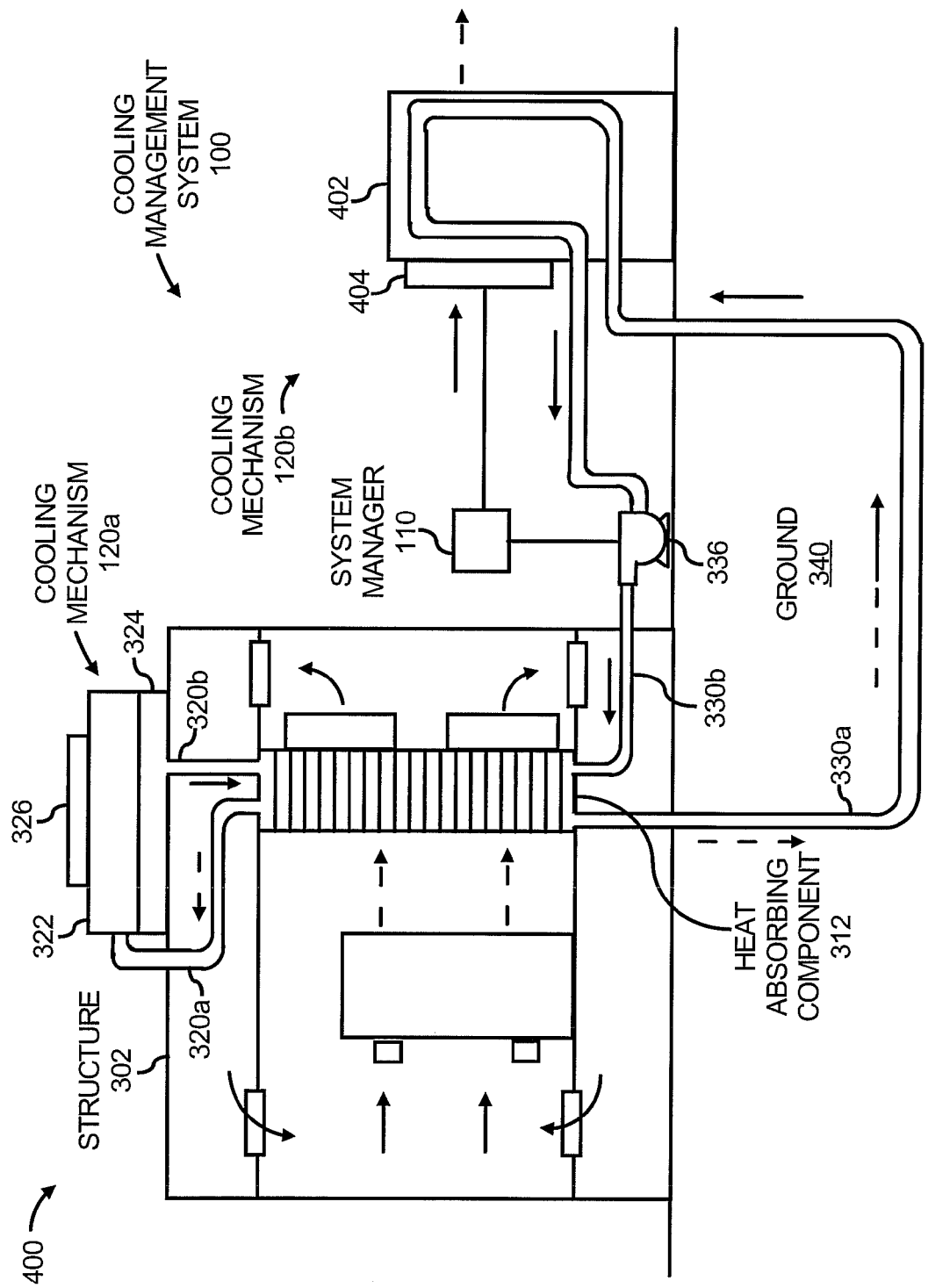
Figure 5:
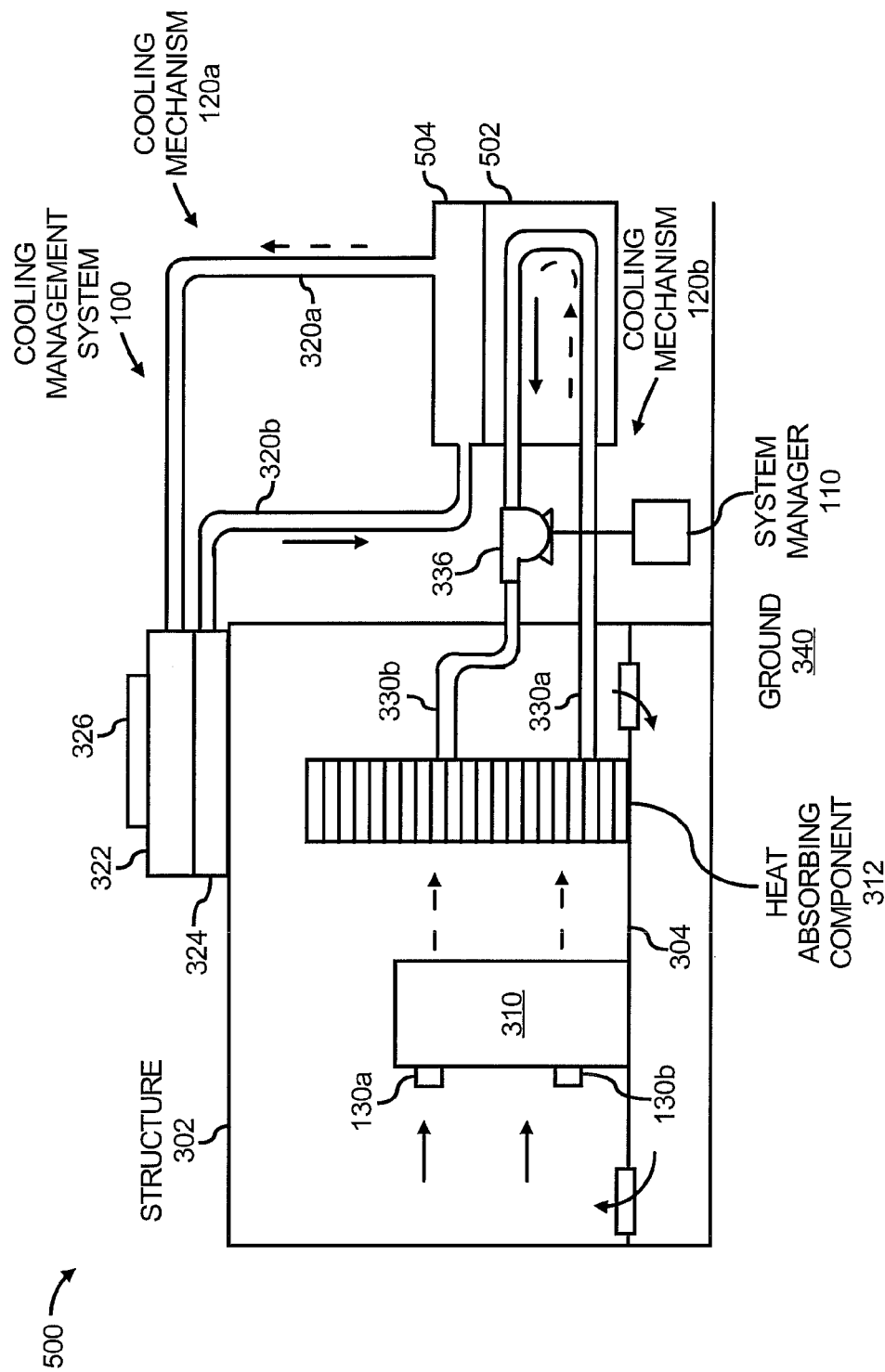

The "passive" cooling mechanisms generally comprise cooling mechanisms that require little to no electrical energy to cause the cooling medium to flow between the heat absorption section and the heat removal section. In other words, the passive cooling mechanisms are physically configured and contain an appropriate cooling medium to enable the cooling medium to flow through phase changes and the effects of gravity. In addition, the passive cooling mechanisms may include one or more fans positioned to enhance removal of heat from the cooling medium at the heat removal section. An example of a suitable passive cooling mechanism is a loop thermosiphon as shown in FIGS. 3-5.

The "active" cooling mechanisms may generally be defined as cooling mechanisms that require electrical energy to cause the cooling medium to flow therethrough. The active cooling mechanisms may thus include, for instance, one or more pumps, compressors, etc., configured to impart motive force on the cooling medium and cause the cooling medium to flow between a heat absorption section and a heat removal section. Examples of suitable active cooling mechanisms include a ground-coupled chiller loop, a vapor-compression loop, a cooling tower with one or more fans, etc.

According to an example, the staged modulation module 116 may further implement the cooling mechanisms 120a-120n based upon data received from one or more sensors 130a-130n. The sensors 130a-130n may also be interfaced with the system manager 110 through the input module 118. The sensors 130a-130n may be positioned at various locations throughout the structure, for instance, at those locations where temperature control is desired. By way of particular example, the structure may comprise an IT data center housing a plurality of electronics cabinets. In this example, a plurality of sensors 130a-130n may be positioned at the inlets of some or all of the electronics cabinets and the staged modulation module 116 may use the data collected by the sensors 130a-130n to modulate one or more of the cooling mechanisms 120a-120n in an effort to substantially maintain temperatures at the inlets of the electronics cabinets within predetermined temperature ranges.

Although the cooling management system 100 has been depicted as including three or more cooling mechanisms 120a-120n, it should be understood that the cooling management system 100 may include any reasonably suitable number of cooling mechanisms 120a-120n.

In any regard, various operations of the system manager 110 in managing a structure with multiple cooling mechanisms having at least one different level of a metric are described in greater detail with respect to the following figures. In addition, specific examples of structures containing various types of cooling mechanisms are provided in the following figures.

Figure 2:
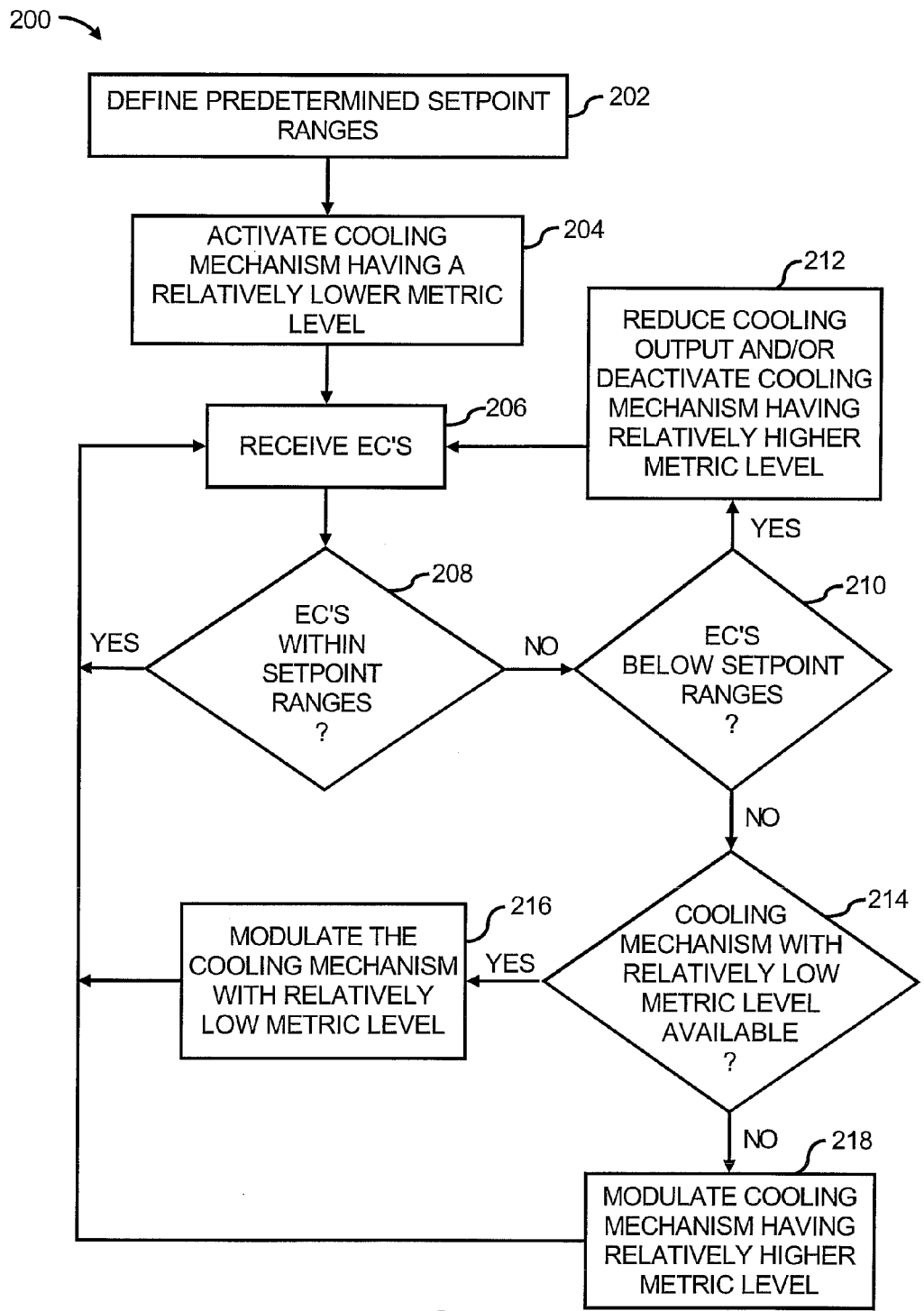
FIG. 2 a flow diagram of a method for cooling a structure with a plurality of separate cooling mechanisms having at least one different level of a metric, according to another embodiment of the invention.

With reference first to FIG. 2, there is shown a flow diagram of a method 200 for managing a structure with a plurality of separate cooling mechanisms having at least one different level of a metric, according to an example. It is to be understood that the following description of the method 200 is but one manner of a variety of different manners in which an example of the invention may be practiced. It should also be apparent to those of ordinary skill in the art that the method 200 represents a generalized illustration and that other steps may be added or existing steps may be removed, modified or rearranged without departing from a scope of the method 200.

The description of the method 200 is made with reference to the cooling management system 100 illustrated in FIG. 1, and thus makes reference to the elements cited therein. It should, however, be understood that the method 200 is not limited to the elements set forth in the cooling management system 100. Instead, it should be understood that the method 200 may be practiced by a system having a different configuration than that set forth in the cooling management system 100.

Generally speaking, the method 200 may comprise an algorithm or program of the staged modulation module 116. In this regard, the controller 112 may implement or invoke the staged modulation module 116 in performing the method 200 to operate multiple cooling mechanisms 120a-120n to, for instance, substantially maintain temperatures within a structure within predetermined ranges. In one example, the predetermined ranges may be defined by or derived from one or more service level agreements (SLAs).

As an initial step, which may be performed, for instance, at a design and/or construction stage of the structure, at least one level of a metric of the cooling mechanisms 120a-120n may be identified. The metric levels may also be identified at a later time in the structure's operation. According to an example, the metric levels of the cooling mechanisms 120a-120n are generally defined as the amount of energy the cooling mechanisms 120a-120n consume during their operations. The respective energy consumption levels may comprise the maximum amount of energy, the nominal amount of energy, the average amount of energy, etc., that the cooling mechanisms 120a-120n consume during their operations.

According to another example, the metric levels of the cooling mechanisms 120a-120n are generally defined as the total cost of ownership for each of the cooling mechanisms 120a-120n and may include, for instance, the energy consumption levels, the initial set-up costs, maintenance costs, etc. As a further example, the metric levels of the cooling mechanisms 120a-120n are generally defined as the energy loss values of the cooling mechanisms 120a-120n and may include, for instance, the amount of energy destroyed during the fabrication of the cooling mechanisms 120a-120n, the amount of energy destroyed during operations of the cooling mechanisms 120a-120n, the amount of energy destroyed during the removal of the cooling mechanisms 120a-120n, etc.

The metric levels may be determined from manufacturer data and/or from testing during operation of the cooling mechanisms 120a-120n. In addition, the metric levels may be inputted into the system manager 110 through use of an input source 140 and may be stored in the memory 114.

In any regard, the controller 112 is generally configured to implement or invoke the method 200 to maintain the temperatures within the structure at the highest acceptable levels, to substantially minimize usage of the cooling mechanisms 120a-120n having the higher metric levels.

As another initial step, in structures having various zones or multiple cooling mechanisms 120a-120n arranged to cool different areas within the structures, regions of influence of the cooling mechanisms 120a-120n may be identified. The regions of influence generally identify over which zones or areas each of the multiple cooling mechanisms 120a-120n has a particular level of influence. The regions of influence may therefore be used to determine which of the cooling mechanisms 120a-120n should be modulated to achieve desired results in one or more zones or areas in the structure. This step may be omitted, for instance, in configurations where the structure includes a single zone or area or in configurations where all of the cooling mechanisms 120a-120n supply cooling to the same zones or areas of the structure.

By way of example, in a structure, such as a building having multiple floors, each of the floors may have a separate cooling mechanism 120a-120n. In this example, a particular floor in the building may be considered as being within the region of influence of one or more cooling mechanisms 120a-120n that provide cooling to that particular floor.

In another example, in a structure, such as an IT data center, electronics cabinets may be classified according to the criticalities of the workloads performed by the servers contained therein. In this example, those electronics cabinets classified as being more critical may be cooled by a greater number of separate cooling mechanisms as compared with those electronics cabinets classified as being less critical. As such, the more critical electronics cabinets may have greater levels of redundancy and may thus be less prone to failure.

Cooling mechanisms 120a-120n that indirectly provide cooling to the various zones or areas are also considered as having regions of influence. For example, a first cooling mechanism 120a configured to draw heat from a second cooling mechanism 120b, where the second cooling mechanism 120b directly cools a zone in the structure, is also considered as cooling that zone. In other words, that zone is also considered as being within a region of influence of the first cooling mechanism 120a and the second cooling mechanism 120b. According to further examples, the first cooling mechanism 120a may be configured to draw heat from more than one second cooling mechanisms 120b-120n and may thus comprise multiple regions of influence. The second cooling mechanisms 120b-120n may also transfer heat to more than one first cooling mechanisms 120a, where each of the first cooling mechanisms 120a is configured to indirectly dissipate heat generated in the structure by dissipating heat absorbed by one or more of the second cooling mechanisms 120b-120n.

With particular reference back to FIG. 2, at step 202, the controller 112 is configured to define predetermined setpoint ranges at one or more locations in the structure. As the names suggest, the predetermined setpoint ranges may define target ranges at the one or more locations. By way of particular example, the predetermined setpoint ranges may define target temperature ranges at the inlets of electronics cabinets housed in an IT data center structure.

According to an example, the predetermined setpoint ranges may comprise ranges of safe operating temperatures for the components housed in the electronics cabinets. The predetermined setpoint ranges may also comprise ranges of temperatures identified as providing a comfortable environment for individuals located in a structure. In these examples, the controller 112 may be programmed with the predetermined setpoint ranges.

According to another example, the controller 112 is configured to define the predetermined setpoint ranges based upon provisions contained in one or more service level agreements (SLAs). By way of particular example, the one or more SLAs may directly state environmental conditions that the various locations are to maintain. As another example, the terms contained in one or more SLAs may be interpreted to determine the level of "damage" that the components, such as, servers, memories, etc., are allowed to undergo during the performance of various workloads. Under this example, there may be three levels of "damage", including, no change in performance is allowed, change in performance is allowed, but errors are recoverable with retries, and system is allowed to shutdown.

Each of the levels of "damage" may be associated with a different predetermined setpoint range. For instance, the "no change in performance is allowed" may be associated with the lowest predetermined setpoint range to substantially prevent failures on the components. In addition, the "system is allowed to shutdown" level may be associated with the highest predetermined setpoint range to substantially minimize costs associated with cooling the components. Furthermore, the "change in performance" level may be associated with a predetermined setpoint range that falls between the first two predetermined setpoint temperature ranges.

According to an example, the controller 112 may define different predetermined setpoint ranges for different zones in the structure. The controller 112 may define the different predetermined setpoint ranges, for instance, where a first zone contains components configured to perform a first workload under a first SLA and a second zone contains components configured to perform a second workload under a second SLA.

At step 204, the controller 112 may activate one or more of the cooling mechanisms 120a-120n having relatively low metric levels, such as, one or more of the cooling mechanisms 120a-120n having the lowest metric levels. According to an example where one or more of the cooling mechanisms 120a-120n comprise passive cooling mechanisms, the controller 112 may cause one or more valves in the passive cooling mechanisms to open, thereby enabling cooling medium contained therein to cycle through the one or more passive cooling mechanisms. In an example where one or more of the cooling mechanisms 120a-120n comprise active cooling mechanisms, the controller 112 may activate one or more of the active cooling mechanisms having relatively lower energy consumption levels.

In this example, the controller 112 may increase either or both of the number of active cooling mechanisms 120a-120n activated and the operations of currently active cooling mechanisms 120a-120n if conditions detected in the structure warrant the increase. Alternatively, however, the controller 112 may activate all or nearly all of the cooling mechanisms 120a-120n and may scale down the use of the active cooling mechanisms if conditions detected in the structure allow for the decrease.

At step 206, the controller 112 receives environmental conditions (EC's) detected by one or more of the sensors 130a-130n. At step 208, the controller 112 analyzes the received environmental conditions to determine whether the environmental conditions are within predetermined setpoint ranges defined at step 202.

If the analysis indicates that the environmental conditions are within the predetermined setpoint ranges, the controller 112 continues to receive detected environmental condition data from the one or more sensors 130a-130n. However, if the analysis indicates that the environmental conditions are outside of the predetermined setpoint ranges, the controller analyzes the environmental conditions to determine whether the environmental conditions are below the predetermined setpoint ranges, as indicated at step 210.

If the analysis performed at step 210 indicates that the environmental conditions are below the predetermined setpoint ranges, the controller 112 reduces the cooling output of one or more of the cooling mechanisms 120a-120n. In addition, or alternatively, the controller 112 deactivates one or more of the cooling mechanisms 120a-120n having the relatively higher metric levels at step 212.

Following step 212, the controller 112 may continue to receive environmental conditions detected by the sensors 130a-130n at step 206. In addition, the controller 112 may repeat steps 208-212 to substantially continuously reduce the metric levels of the cooling mechanisms 120a-120n, if reductions are available.

If, however, the analysis performed at step 210 indicates that the environmental conditions are above the predetermined setpoint temperature ranges, the controller 112 determines whether a cooling mechanism 120a-120n with a relatively low metric level is available, as indicated at step 214. At step 214, more particularly, the controller 112 determines whether there are any available cooling mechanisms 120a-120n that have not yet been activated or have available capacity and have a relatively lower metric level as compared with the one or more cooling mechanisms 120a-120n that have already been activated.

If the controller 112 determines that a cooling mechanism 120a with a relatively low metric level is available, the controller 112 modulates that cooling mechanism 120a to thereby increase the cooling provided by that cooling mechanism 120a, as indicated at step 216. The controller 112 may modulate that cooling mechanism 120a by activating the cooling mechanism 120a if in a deactivated state or by increasing the cooling mechanism 120a operation.

If, however, the controller 112 determines that a cooling mechanism 120a with a relatively low metric level is unavailable at step 214, the controller modulates another cooling mechanism 120b having a relatively higher metric level, as indicated at step 218. Again, the controller 112 may modulate that cooling mechanism 120b by activating the cooling mechanism 120b if in a deactivated state or by increasing the cooling mechanism 120b operation.

Following either or both of steps 216 and 218, the controller 112 may repeat steps 206-218 for any reasonably suitable duration of time or number of iterations to sufficiently cool the cooling fluid while efficiently managing the structure.

Through implementation of the method 200, when one or more of the environmental conditions detected by the sensors 130a-130n and received at step 206 are above the predetermined setpoint range, the controller 112, for instance, seeks to decrease the temperature of cooling fluid supplied to the locations of the sensors 130a-130n by modulating cooling mechanisms 120a-120n having the relatively lower metric levels before modulating cooling mechanisms 120a-120n having relatively higher metric levels. Likewise, when one or more of the environmental conditions detected by the sensors 130a-130n and received at step 206 are below the predetermined setpoint range, the controller 112, for instance, seeks to increase the temperature of cooling fluid supplied to the locations of the sensors 130a-130n by modulating cooling mechanisms 120a-120n having the highest metric levels before modulating cooling mechanisms 120a-120n having lower metric levels. In this regard, for instance, the amount of energy consumed by the cooling mechanisms 120a-120n in maintaining the temperatures in the structure within the predetermined setpoint temperature ranges may substantially be minimized.

Some or all of the operations set forth in the method 200 may be contained as at least one utility, program, or subprogram, in any desired computer accessible medium. In addition, some or all of the steps in the method 200 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Turning now to FIGS. 3-5, there are shown simplified schematic diagrams 300, 400, and 500 of various structures having a cooling management system 100 composed of a plurality of cooling mechanisms 120a-120n, according to three examples. It should be understood that the diagrams 300, 400, and 500 may include additional components and that some of the components described herein may be removed and/or modified without departing from a scope of the cooling management system 100. In addition, it should be understood that the cooling management system 100 may be implemented in structures having configurations other than those depicted in the diagrams 300, 400, and 500. Moreover, it should be understood that the examples of cooling mechanisms 120a-120n may be applied to smaller-scale structures, such as, rooms within buildings, zones within rooms, electronics cabinets, etc.

Generally speaking, the diagrams 300, 400, and 500 depict examples of the cooling management system 100. In this regard, the diagrams 300, 400, and 500 depict the system manager 110, the plurality of cooling mechanisms 120a-120n, and the plurality of sensors 130a-130n, depicted in the cooling management system 100 of FIG. 1.

With reference first to FIG. 3, the diagram 300 shows a structure 302, in this case, a building, such as, an IT data center along with a cooling management system 100. The structure 302 is depicted as including a raised floor 304 and a lowered ceiling 306. The raised floor 304 and the lowered ceiling 306 include ventilation tiles 308 to enable cooling fluid, such as, air or other suitable substance, to flow around in the structure 302. Positioned on the raised floor 304 is a heat generating component 310, such as, an electronics rack housing a number of servers, power supplies, memories, etc. Also positioned on the raised floor 304 is a heat absorbing component 312, such as, an evaporator or other apparatus in which heat transfer occurs. The heat absorbing component 312 is depicted as including a pair of fans 314 designed to generate airflow through the heat generating component 310 and the heat absorbing component 312.

The solid arrows depicted throughout FIGS. 3-5 generally indicate cooling fluid or cooling medium at a relatively low temperature and the dashed arrows generally indicate cooling fluid or cooling medium that has been heated. As shown, the cooling fluid may become heated as it flows through the heat generating component 310 and may become cooled as it flows through the heat absorbing component 312. The cooling fluid may thus be cycled between cooled and heated states through the structure 302 to remove heat from the heat generating component 310.

The heat removing component 312 includes a plurality of pipes (not shown) through which cooling medium, such as, refrigerant, chilled water, water at reduced pressure, etc., flows. Heat from the cooling fluid is transferred to the cooling medium contained in the pipes through conduction and the heat transfer is enhanced through fins (not shown) that are attached to the pipes.

Although not explicitly shown, the heat removing component 312 includes two sets of separate pipes carrying two separate cooling media. The pipes are separated from each other to prevent the cooling medium in one of the pipes from intermixing with the cooling medium in the other one of the pipes. In addition, both sets of pipes may be configured to extend over a relatively large area of the heat removing component 312 to thereby enable the cooling medium in each of the pipes to have a relatively large area over which heat is transferred from the cooling fluid.

A first set of pipes forms part of a first cooling mechanism 120a and is connected to pipes 320a and 320b of the first cooling mechanism 120a. The pipes 320a and 320b are also connected to a condenser 322 and form a closed loop with the first set of pipes and the condenser 322. A cooling medium configured to undergo phase changes based upon its temperature is contained in the closed loop forming the first cooling mechanism 120a. The cooling medium may include, for instance, water at reduced pressure, a refrigerant, etc., configured to change phase at relatively low temperatures.

The first cooling mechanism 120a generally operates by cycling the cooling medium through a vapor-liquid cycle within the closed loop. More particularly, the cooling medium is mainly a liquid within the first set of pipes and vaporizes as heat is absorbed from the cooling fluid contained in the structure 302, thus cooling the cooling fluid. The vaporized cooling medium flows upward through the pipe 320a and collects in the condenser 322. Some of the heat contained in the vaporized cooling medium is dissipated through the condenser 322 and the vaporized cooling medium condenses into a liquid 324. The removal of heat from the cooling medium may be enhanced through operation of a fan 326. In any regard, the liquid cooling medium is delivered back into the evaporator 312 through the pipe 320b and the vapor-liquid cycle is repeated to continuously cool the cooling fluid.

The first cooling mechanism 120a is considered a "passive" cooling mechanism because electrical energy is not required to cause the cooling medium to flow through the closed loop.

A second set of pipes forms part of a second cooling mechanism 120b and is connected to pipes 330a and 330b of the second cooling mechanism 120b. The pipes 330a and 330b are also connected to an accumulator 332, a heat exchanger 334, and a pump 336. The second cooling mechanism 120b also forms a closed loop having a cooling medium configured to flow through the loop. The cooling medium generally comprises a liquid that absorbs heat from the cooling fluid at the evaporator 312. The heated cooling medium flows down through the pipe 330a, which may be buried in the ground 340 to a depth where the ground has a relatively low temperature as compared with ambient air temperatures around the structure 302.

As the cooling medium flows through the pipe 330a, heat from the cooling medium is dissipated into the ground, thereby cooling the cooling medium, as indicated by the dashed and solid arrows. The cooled cooling medium collects in the accumulator 332 prior to being reinserted into the second set of pipes through the pipe 330b. The pump 336 applies pressure on the cooling medium to thereby cause the cooling medium to flow through the closed loop. In this regard, the second cooling mechanism 120b is considered an "active" cooling mechanism since electrical energy is required to cause the cooling medium to flow through the closed loop.

The cooling medium contained in the second cooling mechanism 120b may be further cooled through transfer of heat at the heat exchanger 334. At the heat exchanger 334, more particularly, heat from the cooling medium contained in the second cooling mechanism 120b is transferred to a cooling medium contained in a third cooling mechanism 120c, thereby further cooling the cooling medium contained in the second cooling mechanism 120b. However, if the controller 112 determines that the temperature of the cooling medium contained in the accumulator 332 supplied directly from the pipe 330a is sufficiently cool, the controller 112 may not activate or may maintain the third cooling mechanism 340 in a relatively lower power state.

The third cooling mechanism 120c generally comprises a vapor-compression type cooling mechanism, including an evaporator (heat exchanger 334), a compressor 340, a condenser 342, and an expansion valve 344. The condenser 342 also includes a fan 346 for increasing the removal of heat from a cooling medium contained in a loop 350 that connects the components of the third cooling mechanism 120c together. The third cooling mechanism 120c is also considered an "active" cooling mechanism since electrical energy is required to provide motive force on the cooling medium to flow through the loop 350.

The second cooling mechanism 120b and the third cooling mechanism 120c have power consumption levels that are relatively higher than the first cooling mechanism 120a. In addition, the third cooling mechanism 120c may have a power consumption level that is relatively higher than the power consumption level of the second cooling mechanism 120b. However, the controller 112 may substantially minimize energy consumption by substantially limiting activation and increased operation of the third cooling mechanism 120c until the additional cooling is required.

In operation, the system manager 110 may modulate either or both of the pump 332 and the compressor 340 to vary the temperature of the cooling medium contained in the second and third cooling mechanisms 120b and 120c, and thereby vary the temperature of the cooling fluid contained in the structure 302. According to the method 200, the system manager 110 may maintain the second and third cooling mechanisms 120b and 120c in inactive or relatively low power states when the first cooling mechanism 120a is capable of maintaining, for instance, the temperature of the cooling fluid within the predetermined setpoint range. In addition, the system manager 110 may modulate the second cooling mechanism 120b when the first cooling mechanism 120a is incapable of sufficiently cooling the cooling fluid. The system manager 110 may also modulate the third cooling mechanism 120c when the first cooling mechanism 120a and the second cooling mechanism 120b are incapable of sufficiently cooling the cooling fluid. As such, the system manager 110, or the controller 112, more particularly, is configured to implement the cooling mechanisms 120a-120c in a staged manner, which substantially minimizes the amount of energy consumed, the total cost of ownership, the energy loss of the cooling mechanisms 120a-120n, etc., in cooling the cooling fluid in the structure 302.

Although the heat removing component 312 has been described as containing both sets of pipes for the first cooling mechanism 120a and the second cooling mechanism 120b, it should be understood that the first cooling mechanism 120a and the second cooling mechanism 120b may each include separate heat removing components 312 without departing from a scope of the cooling management system 100 described herein.

In addition, although the second cooling mechanism 120b has been described as containing pipes 330a that extend into the ground 340, the pipes 330a may extend into other relatively lower temperature locations depending upon the geographic location of the structure 302. By way of example, the pipes 330a may extend into water, air, ice, etc., in situations where such materials are available and have sufficiently low temperatures to adequately cool the cooling medium contained in the second cooling mechanism 120b.

Turning now to FIG. 4, the diagram 400 shows the structure 302 depicted in FIG. 3 with a different cooling management system 100, according to another example. The cooling management system 100 includes the same first cooling mechanism 120a depicted in FIG. 3. However, the cooling management system 100 depicted in FIG. 4 differs from FIG. 3 in that the third cooling mechanism 120c has been removed and the second cooling mechanism 120b includes a cooling tower 402. The cooling tower 402 includes a fan 404 configured to cause ambient airflow to pass through the cooling tower, thereby further cooling the cooling medium in the second cooling mechanism 120b.

In this example, the cooling medium contained in the second cooling mechanism 120b is initially cooled by the difference in temperature with the ground 340. When the ground loop 330a is incapable of sufficiently cooling the cooling medium, the system manager 110 or, more particularly, the controller 112, modulates the fan 404 to further cool the cooling medium. Alternatively, the controller 112 reduces the fan 404 operation when the ground loop 330a section or the first cooling mechanism 120a is capable of sufficiently cooling the cooling fluid.

Turning now to FIG. 5, the diagram 500 shows the structure 302 depicted in FIG. 3 with a different cooling management system 100, according to an example. The cooling management system 100 includes a first cooling mechanism 120a and a second cooling mechanism 120b. The first cooling mechanism 120a comprises a passive cooling mechanism, which requires little to no electrical energy to operate.

In the diagram 500, the evaporator 312 includes a single set of pipes that is connected to the pipes 330a and 330b of the second cooling mechanism 120b. Also, the pipe 330a is depicted as being above the ground 340 and positioned within a heat exchanger 502. The heat exchanger is shown as including a compartment 504 for receiving a cooling medium of the first cooling mechanism 120a.

In operation, heat from the cooling medium contained in the second cooling mechanism 120b is transferred to the cooling medium contained in the first cooing medium, which causes the cooling medium in the compartment 504 to evaporate. The vaporized cooling medium is cooled and condensed in the condenser 322 and returned to the heat exchanger 502, as discussed above with respect to FIG. 3.

The cooled cooling medium in the second cooling mechanism 120b is returned to the evaporator 312 to repeat the cooling cycle on the cooling fluid contained in the structure 302.

In this example, the system manager, or more particularly, the controller 112, modulates the pump 336 of the second cooling mechanism 120b to vary the temperature of the cooling fluid.

Figure 6:
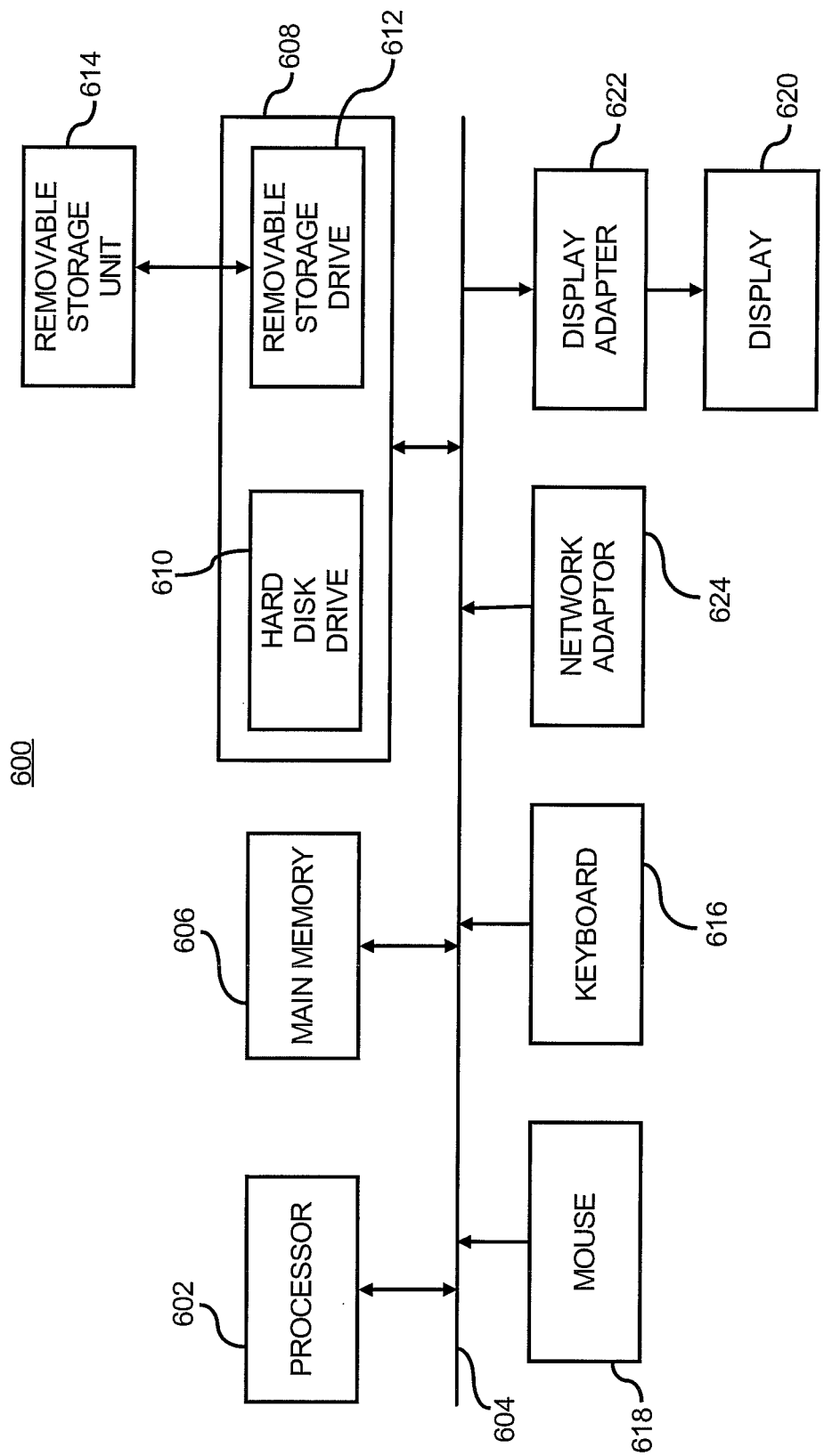
FIG. 6 illustrates a computer system, which may be employed to perform various functions of a system manager, according to an embodiment of the invention.

FIG. 6 illustrates a computer system 600, which may be employed to perform the various functions of system manager 110 described herein above, according to an example. In this respect, the computer system 600 may be used as a platform for executing one or more of the functions described hereinabove with respect to the system manager 110.

The computer system 600 includes a processor 602, which may be used to execute some or all of the steps described in the method 200. Commands and data from the processor 602 are communicated over a communication bus 604. The computer system 600 also includes a main memory 606, such as a random access memory (RAM), where the program code for, for instance, the system manager 110, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for managing a structure may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for managing a structure having cooling fluid that is to flow around and absorb heat from components contained in the structure, said system comprising:
   a plurality of separate cooling mechanisms to absorb heat from the cooling fluid, at least two of said plurality of separate cooling mechanisms having a different level of a metric with respect to each other, wherein one of the plurality of separate cooling mechanisms is a passive cooling mechanism and another one of the plurality of separate cooling mechanisms is an active cooling mechanism, wherein the passive cooling mechanism includes a first cooling medium and the active cooling mechanism includes a second cooling medium, and wherein the first cooling medium is separated from second cooling medium;
   a controller to implement the plurality of separate cooling mechanisms in a staged manner to remove heat from the cooling fluid, wherein the staged manner comprises implementing the passive cooling mechanism first and implementing the active cooling mechanism second, to manage the structure, and
   wherein the controller is further to define a plurality of setpoint ranges of the active cooling mechanism that respectively correspond to different risks of damage to the components, wherein the controller is to receive an instruction to implement a selected one of the plurality of setpoint ranges and to implement the selected one of the plurality of setpoint ranges in controlling the active cooling mechanism.

2. The system according to claim 1, wherein the passive cooling mechanism includes a first heat absorbing component and wherein the first cooling medium is to flow through the first heat absorbing component, wherein the active cooling mechanism includes a second heat absorbing component and wherein the second cooling medium is to flow through the second heat absorbing component.

3. The system according to claim 2, wherein the passive cooling mechanism requires no electrical energy to cool the first cooling medium and the active cooling mechanism requires electrical energy to cool the second cooling medium.

4. The system according to claim 1, wherein the passive cooling mechanism comprises a loop thermosiphon having a condenser and an evaporator, wherein the condenser is positioned at a vertically higher position than the evaporator, wherein the first cooling medium of the loop thermosiphon is to flow between the evaporator and the condenser through phase changes in the first cooling medium.

5. The system according to claim 1, wherein the active cooling mechanism comprises at least one of a ground-coupled loop and a chiller apparatus.

6. The system according to claim 1, wherein the active cooling mechanism comprises a ground-coupled loop having a cooling tower to remove additional heat from the second cooling medium contained in the active cooling mechanism.

7. The system according to claim 1, wherein the passive cooling mechanism and the active cooling mechanism share a common evaporator, wherein the common evaporator comprises a plurality of pipe sets to maintain separation of the first cooling medium from the second cooling medium.

8. The system according to claim 1, further comprising:
   a sensor to detect an environmental condition of the cooling fluid at a location in the structure; and
   wherein the controller is further to implement the plurality of separate cooling mechanisms in a staged manner to substantially maintain the detected environmental condition within a predetermined range.

9. The system according to claim 8, wherein the structure comprises a building and the components comprise electronic devices, and wherein the sensor is to detect a temperature at a location of an electronic device.

10. The system according to claim 8, wherein the plurality of separate cooling mechanisms further comprise a second active cooling mechanism having a third cooling medium, wherein the third cooling medium is to remove heat from the second cooling medium, and wherein the controller is further to modulate the second active cooling mechanism to modulate heat removal from the second cooling medium and the cooling fluid.

11. The system according to claim 1, wherein the structure is divided into a plurality of zones, and wherein each of the plurality of zones is to be cooled by a plurality of separate cooling mechanisms, where at least two of the plurality of separate cooling mechanisms have different energy consumption levels with respect to each other.

12. The system according to claim 1, wherein the different metric level comprises one of an energy consumption level, a total cost of ownership, and an exergy loss of the plurality of cooling mechanisms.

13. A method for managing a structure having cooling fluid that is to flow around and absorb heat from components contained in the structure with a plurality of separate cooling mechanisms having different levels of a metric with respect to each other, wherein one of the plurality of separate cooling mechanisms is a passive cooling mechanism and another one of the plurality of separate cooling mechanisms is an active cooling mechanism, wherein the passive cooling mechanism includes a first cooling medium and the active cooling mechanism includes a second cooling medium, and wherein the first cooling medium is separated from second cooling medium, said method comprising:
   defining a plurality of setpoint ranges of the active cooling mechanism that respectively correspond to different risks of damage to the components;
   receiving an instruction to implement a selected one of the plurality of setpoint ranges;
   receiving an environmental condition detected at a location in the structure;
   determining whether the environmental condition is below the selected one of the plurality of setpoint ranges;
   in response to the environmental condition falling below the selected one of the plurality of setpoint ranges, implementing the passive cooling mechanism without implementing the active cooling mechanism; and
   in response to the environmental condition exceeding the selected one of the plurality of setpoint ranges, activating the active cooling mechanism.

14. The method according to claim 13, wherein the environmental condition comprises temperature, wherein the selected one of the plurality of setpoint ranges comprises a setpoint temperature range, said method further comprising:
   determining whether implementing the passive cooling mechanism while the active mechanism is not operating resulted in maintaining the temperature within the setpoint temperature range; and
   in response to the temperature being above the setpoint temperature range, activating the active cooling mechanism to be operational.

15. The method according to claim 13, further comprising:
   at least one of reducing cooling output from and deactivating the active cooling mechanism in response to a determination that an environmental condition is below the first selected one of the plurality of setpoint ranges.

16. The method according to claim 13, wherein the passive cooling mechanism includes a first heat absorbing component and wherein the first cooling medium is to flow through the first heat absorbing component, wherein the active cooling mechanism includes a second heat absorbing component and wherein the second cooling medium is to flow through the second heat absorbing component.

17. The method according to claim 16, wherein the passive cooling mechanism requires no electrical energy to cool the first cooling medium and the active cooling mechanism requires electrical energy to cool the second cooling medium.

18. The method according to claim 13, wherein the plurality of separate cooling mechanisms further comprise a second active cooling mechanism having a third cooling medium, wherein the second cooling medium is to remove heat from the second cooling medium, said method further comprising:
   determining whether the one or more environmental conditions are above a another one of the plurality of setpoint ranges; and
   in response to the one or more environmental conditions exceeding the another one of the plurality of setpoint ranges, modulating the second active cooling mechanism to increase heat removal from the second cooling medium.

19. The method according to claim 13, further comprising:
   defining the plurality of setpoint ranges from provisions set forth in one or more service level agreements that define various manners in which the structure is to be operated.

20. The method according to claim 13, wherein the structure is divided into a plurality of zones and wherein each of the plurality of zones is to be cooled by a plurality of separate cooling mechanisms, where at least two of the plurality of separate cooling mechanisms have different metric levels with respect to each other, said method further comprising:
   modulating the plurality of separate cooling mechanisms in at least two of the zones independently with respect to each other.

21. A non-transitory computer readable storage medium on which is embedded machine readable instructions that, when executed by a processor implements a method for cooling a structure having cooling fluid that is to flow around and absorb heat from components contained in the structure with a plurality of separate cooling mechanisms having different levels of a metric with respect to each other, wherein one of the plurality of separate cooling mechanisms is a passive cooling mechanism and another one of the plurality of separate cooling mechanisms is an active cooling mechanism, wherein the passive cooling mechanism includes a first cooling medium and the active cooling mechanism includes a second cooling medium, and wherein the first cooling medium is separated from the second cooling medium, wherein said machine readable instructions are to cause the processor to:
   define a plurality of setpoint ranges of the active cooling mechanism that respectively correspond to different risks of damage to the components;
   receive an instruction to implement a selected one of the plurality of setpoint ranges;
   receive an environmental condition detected at a location in the structure;
   determine whether the environmental condition is below the selected one of the plurality of setpoint ranges; and
   in response to the environmental condition falling below the selected one of the plurality of setpoint ranges, implement the passive cooling mechanism while the active cooling mechanism is not operating; and
   in response to the environmental condition exceeding the selected one of the plurality of setpoint ranges, activate the active cooling mechanism.

* * * * *